United States Patent
Khurana et al.

(10) Patent No.: US 6,395,157 B2
(45) Date of Patent: *May 28, 2002

(54) METHOD AND APPARATUS FOR SPUTTER ETCH CONDITIONING A CERAMIC BODY

(75) Inventors: Nitin Khurana, Santa Clara; Vince Burkhart; Steve Sansoni, both of San Jose; Vijay Parkhe, Sunnyvale; Eugene Tzou, Los Altos, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,009

(22) Filed: Sep. 23, 1998

Related U.S. Application Data

(63) Continuation of application No. 08/814,188, filed on Mar. 10, 1997, now Pat. No. 5,861,086.

(51) Int. Cl.[7] .............................................. C23C 14/34
(52) U.S. Cl. ............................ 204/298.34; 204/298.33; 204/298.31; 204/298.06; 204/298.07; 204/298.08; 204/298.15
(58) Field of Search ...................... 204/298.06, 298.07, 204/298.08, 298.15, 298.31, 298.33, 298.34

(56) References Cited

U.S. PATENT DOCUMENTS

| | | | | |
|---|---|---|---|---|
| 3,775,285 A | * | 11/1973 | Lane | 204/298.08 |
| 4,450,062 A | * | 5/1984 | Macaulay | 204/298.11 |
| 5,221,450 A | * | 6/1993 | Hattori et al. | 204/192.32 |
| 5,442,200 A | * | 8/1995 | Tischler | 257/77 |
| 5,688,330 A | * | 11/1997 | Ohmi | 204/298.06 |
| 5,861,086 A | * | 1/1999 | Khurana et al. | 204/192.32 |

OTHER PUBLICATIONS

Kirk–Othmer, "Encyclopedia of Chemical Technology", Third Edition, vol. 5, pp. 234–236, 286–287, 290–314, 1979.*

* cited by examiner

Primary Examiner—Rodney G. McDonald
(74) Attorney, Agent, or Firm—Thomason, Moser & Patterson LLP

(57) ABSTRACT

A method and apparatus for conditioning a surface of a ceramic body in a process chamber when the process chamber has a vacuum pump, an anode and a cathode. The conditioning method consists of pumping the process chamber down to a vacuum with the vacuum pump, introducing a gas into the chamber, energizing the anode and cathode with RF power to ignite the gas into a plasma, sputter etchinq the surface with ions from the plasma to remove contaminants therefrom. The method is accomplished either within a process chamber to condition, in situ, a ceramic chuck or within a cleaning chamber to condition any form of ceramic body or component.

4 Claims, 2 Drawing Sheets

METHOD AND APPARATUS FOR SPUTTER ETCH CONDITIONING A CERAMIC BODY

This application is a continuation of Ser. No. 08/814,188 filed Mar. 10, 1997 now U.S. Pat. No. 5,861,086.

BACKGROUND OF THE DISCLOSURE

1. Field of the Invention

The invention relates to processes for cleaning and conditioning ceramic components of a semiconductor wafer processing system. More particularly, the invention relates to a method and apparatus for cleaning the surface of an electrostatic ceramic chuck and other ceramic components of semiconductor wafer processing equipment using a plasma.

2. Description of the Background Art

Plasma-based reactions have become increasingly important to the semiconductor industry, providing for precisely controlled thin-film depositions. For example, a plasma reactor in a high-temperature physical vapor deposition (PVD) semiconductor wafer processing system generally comprises a reaction chamber for containing a reactant gas, a pair of spaced-apart electrodes (cathode and anode) to generate an electric field within the chamber, and a substrate support for supporting a substrate within the electric field. The cathode is typically embedded within the substrate support, while the anode is embedded in a target material that is to be sputtered or deposited onto the substrate. The electric field ionizes the reactant gas to produce a plasma. The plasma, characterized by a visible glow, is a mixture of positive and negative reactant gas ions and electrons. Ions from the plasma bombard the target releasing deposition material. As such, a deposition layer forms on the substrate which is supported upon the surface of the substrate support just above the cathode.

A particular type of substrate support used in a high temperature PVD system is a ceramic electrostatic chuck. Ceramic electrostatic chucks create an electrostatic attractive force between the substrate (i.e., a semiconductor wafer) and the chuck to retain the wafer in a stationary position during processing. A voltage is applied to one or more electrodes imbedded within a ceramic chuck body so as to induce opposite polarity charges in the wafer and electrodes, respectively. The opposite charges pull the wafer flush against the chuck support surface, thereby electrostatically clamping the wafer. More specifically, in a "unipolar" electrostatic chuck, voltage is applied to an electrode embedded within the pedestal supporting the chuck. The voltage is referenced to some internal chamber ground reference. Electrostatic force is established between the wafer being clamped and the chuck. When the voltage is applied, the wafer is referred back to the same ground reference as the voltage source through a conductive connection to the wafer. Alternatively, the plasma generated in the chamber can reference the wafer to ground.

The ceramic material used to fabricate a high temperature chuck is typically aluminum-nitride or alumina doped with a metal oxide such as titanium oxide ($TiO_2$) or some other ceramic material with similar resistive properties. This form of ceramic is partially conductive at high temperatures. Because of this characteristic, the wafer is primarily retained against the chuck by the Johnsen-Rahbek effect. Such a chuck is disclosed in U.S. Pat. No. 5,117,121 issued May 26, 1992.

One disadvantage of using a chuck body fabricated from ceramic is that the characteristics of the chuck surface change over time. For example, exposing the chuck surface to organic material degrades chuck performance. Specifically, adventitious (surface) carbon, water and hydroxides collect on the chuck surface. Such contaminants enter the chamber during wafer processing as wafers are passed from a loadlock to the chamber or when the chamber is exposed to the atmosphere during a maintenance cycle. Additionally, outgassing of chamber components produces hydrocarbon contaminants e.g., O-rings inside the chamber breakdown and outgas. These contaminants produce a conductive carbon film on the chuck surface that grows if not removed. Additionally, waste products from wafer processing collect on the chuck surface causing contamination although these process waste products are not considered principle contaminants. The buildup of these contaminants reduces performance of the chuck and, after repeat processing and maintenance cycles, render the chuck useless (i.e., the chucking force is severely degraded and/or non-uniform). Premature replacement of the chuck results in higher unit cost and increased chamber downtime.

Therefore, a need exists in the art for a method of removing contaminant films that become deposited upon the support surface of the chuck as well as upon other ceramic components of a semiconductor wafer processing system.

SUMMARY OF THE INVENTION

The disadvantages of the prior art are overcome by the present invention of a method and apparatus for conditioning a surface of a ceramic body. More specifically, a first embodiment of the invention is a method of using a plasma for in-situ removal of residual surface layer films from a chuck surface in a semiconductor wafer processing chamber. The process chamber contains a vacuum pump, an anode and a cathode. The method comprises the steps of maintaining the process chamber at a vacuum with the vacuum pump, introducing a gas into the chamber, energizing the anode and cathode with RF power to ignite the gas into a plasma, sputtering the surface of the chuck with ions from the plasma to remove contaminants therefrom. Additionally, a plurality of gases can be introduced into the chamber where one gas is inert and another gas is reactive such that the reactive gas bonds with the surface material of the chuck as well as the particulate contaminants dislodged from the surface. Such bonding passivates both the free contaminants and the surface of the chuck.

The second embodiment of the invention is a method and apparatus that performs the sputter cleaning process of the first embodiment within a dedicated cleaning chamber. This chamber contains a cathode pedestal supporting a ceramic component to be cleaned, a grounded anode chamber wall and vacuum pump. The method comprises the steps of creating and maintaining the cleaning chamber at a vacuum with the vacuum pump, introducing a sputter etching gas into the chamber, energizing the anode and cathode with RF power to ignite the gas into a plasma, sputter etching the surface of the chuck with ions from the plasma to remove contaminants therefrom. A reactive gas may also be introduced into the chamber to passivate the free contaminants as well as the ceramic component surfaces.

As a result of using the novel method, the contaminant films adhered to a ceramic body are greatly reduced. When a ceramic chuck is cleaned in accordance with the invention, this substantial improvement in maintaining chuck surface integrity increases chuck life, performance and restores clamping force over numerous processing cycles without excessive chamber maintenance or downtime.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the Figures.

DETAILED DESCRIPTION

Figure 1:
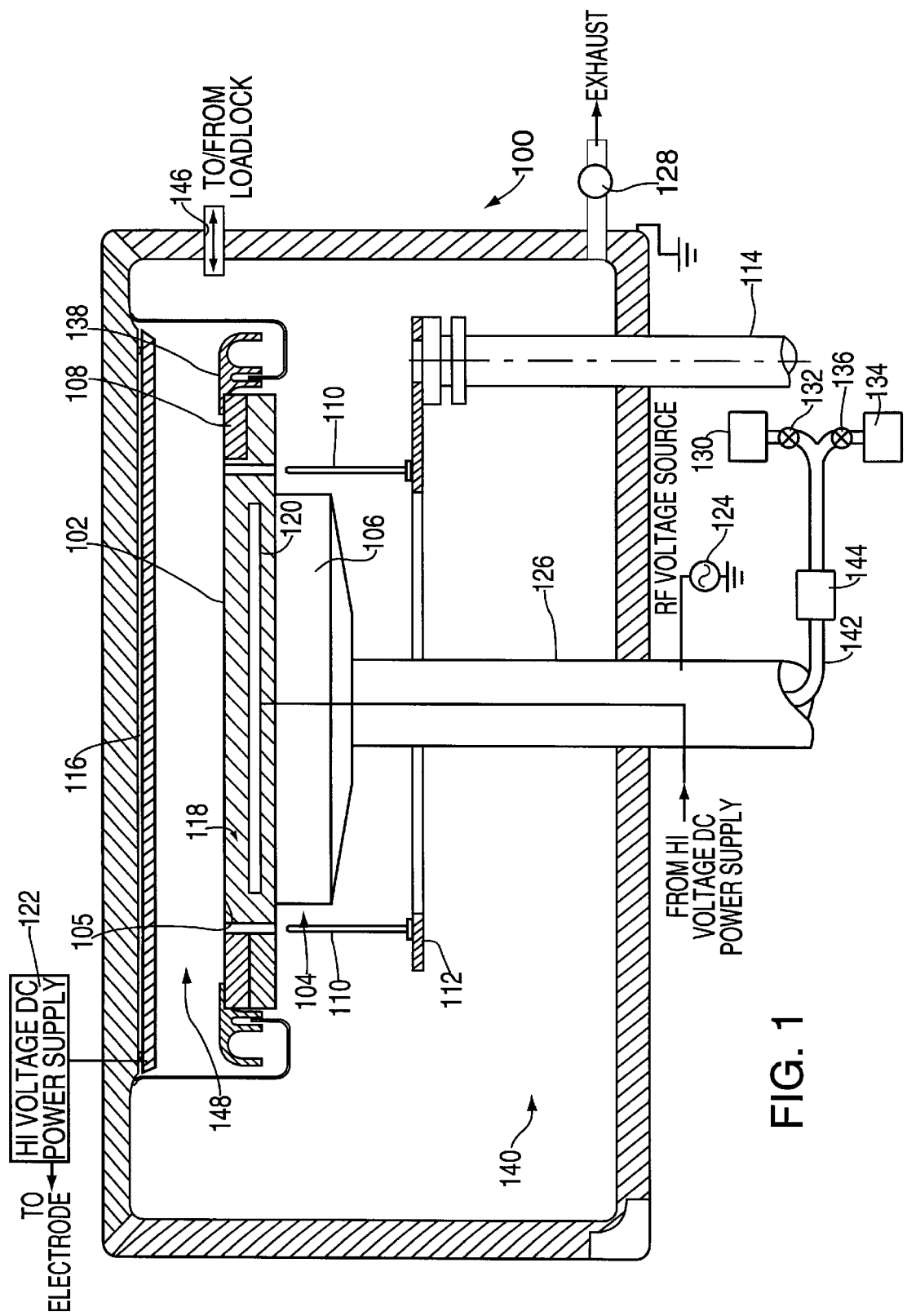
FIG. 1 depicts a cross-sectional view of a PVD chamber for processing semiconductor wafers employing the method of the present invention.

FIG. 1 depicts a cross-sectional view of a PVD wafer processing chamber 100 for processing semiconductor wafers.

For a detailed understanding of the PVD reaction chamber and its operation in processing a wafer, the reader should refer to the drawings and the detailed description contained in commonly assigned U.S. Pat. No. 5,228,501, issued Jul. 20, 1993 incorporated herein by reference. That disclosure discloses a wafer support assembly used in a physical vapor deposition chamber manufactured by Applied Materials, Inc. of Santa Clara, Calif.

The wafer 102 rests on support surface 105 of a substrate support or pedestal 104. The pedestal 104 is supported by a pedestal base 106 and a shaft 126 which contains the necessary wiring to conduct DC and RF power from remote power sources 122 and 124 to the pedestal 104. Additionally, the shaft 126 is provided with a gas conduit 142 to feed a gas through the pedestal 104 to a process cavity 148 located directly above the pedestal 104. The pedestal 104 is also provided with one or more chucking electrodes 120 embedded in a ceramic chuck body 118. Lift pins 110 mounted on a platform 112 connected to a vertical shaft 114 serve to lift the wafer 102 off the pedestal surface 105 after processing.

A target 116 of sputtering or deposition material is positioned over the pedestal 104. The target 116 is usually Aluminum or Titanium and is electrically insulated from the chamber 100. The remote power source 122 is a high voltage DC power supply and is electrically connected between the target 116 and pedestal 104 for magnetron sputtering a wafer. Additionally, an RF (radio frequency) voltage source 124 is coupled to the pedestal 104 via the pedestal base 106. The RF source may also be coupled to the chuck electrode 120. As such, the pedestal 104 forms a cathode and the chamber walls an anode with respect to the RF voltage. Waste ring 108 and cover ring 138 circumscribe the pedestal 104 to prevent unwanted deposition into the lower chamber region 140.

In operation, a wafer 102 is placed on the support surface 105 of the pedestal 104. Air is drawn out of the chamber via a vacuum pump 128 to create a low vacuum environment. A reactant gas, preferably Argon, is introduced into the chamber 100. The power supply 122 is energized which electrostatically clamps the wafer to the support surface 105. Specifically, the power supply 122 applies a DC bias to the electrode 120 within the ceramic chuck body 118. The high voltage level produced by the power supply 122 also ignites the gas into a plasma and biases the target 116 thereby causing the target material to sputter onto the wafer 102.

Minor particulate residue is inadvertently deposited on chuck surface 105 during wafer processing. Conductive films from organic material breakdown during wafer processing form on the chuck surface 105. Exposure of the chuck to the atmosphere after wafer processing also forms conductive films. These contaminants compromise chuck surface integrity and degrade the electrostatic clamping performance.

The conductive films are removed using a novel method of in-situ sputter cleaning of the electrostatic ceramic chuck in a low temperature, low pressure environment using a plasma sustained by an electrically conductive gaseous mix of inert and reactive components. This method of using a plasma to remove contaminants while the wafer is not present is referred to herein as a "sputter etch" process. The sputter etch process produces a plasma of an inert gas whose ions impact the chuck surface removing contaminant films and adsorbed contaminants. As such, the chuck surface 105 is cleaned and restored to its pre-process state.

The condition process is initiated as either a periodic maintenance routine or when the chucking force degrades. Empirical analysis of chuck degradation can lead to a periodic maintenance routine being used to avoid any degradation in chucking force due to contamination of the chuck surface. Alternatively, the chucking force can be monitored and if the chucking force degrades to an unacceptable level, the chuck surface can then be cleaned and conditioned. Consequently, the wafer processing is halted and the sputter etch conditioning process is started without exposing the chuck to the atmosphere. The sputter cleaning process is started by transporting the last processed wafer back to the loadlock (not shown) through a slit valve 146 in the chamber wall. The chamber 100, still under a wafer processing vacuum (approximately $10^{-7}$–$10^{-9}$ torr) is at room temperature. An inert gas (preferably Argon) is introduced from inert gas supply 130 via valve 132, master flow controller 144 and conduit 142 into the chamber 100 to establish an optimal plasma ignition pressure range (preferably 8 mtorr). The RF power source 124 is then energized to ignite the "cleaning plasma". Although other sources may be used, a 13.56 Mhz source 124 is the preferred "cleaning plasma" source because it provides a low bias voltage on the chuck surface. Under these conditions, the "cleaning plasma" selectively sputters the contaminant film but not ceramic material comprising the chuck.

Once the plasma is ignited, the chamber pressure is then reduced for optimal "cleaning plasma" effectiveness or sputter etch rate. This optimal sputter etch rate coincides with a high mean free path of the sputtering ions which occurs at a chamber pressure of approximately 1.5 mtorr and RF power level of 75 W. The "cleaning plasma" is maintained in the chamber as long as necessary to remove the contaminants from the chuck surface. A typical cleaning cycle runs in the range of 2–20 minutes.

Contaminants and waste gases are evacuated from the chamber by two different alternative methods. Using a gas flow method, the vacuum pump 128 continuously pumps contaminants from the chamber 100 thereby maintaining a chamber pressure of approximately 1.5 mtorr during the cleaning cycle. Using a backfill method, pressure is maintained at approximately 8 mtorr after cleaning plasma ignition. The vacuum pump 128 then evacuates contaminants at the conclusion of the cleaning cycle.

More specifically, using Argon as the inert gas, positively charged Argon ions are created within the plasma, which then bombard the negatively biased chuck surface. This activates the ceramic and sputters the relatively weakly bonded residue particles from the chuck surface. Inert gas bombardment also removes the molecules of gases adsorbed within the porous ceramic material constituting the chuck.

To supplement the cleaning effect of the inert gas, a reactive gas may also be introduced into the chamber from reactive gas supply 134 via valve 136. The reactive gas enters the chamber prior to igniting the plasma. Using oxygen as the reactive gas, the ionized oxygen molecules in the plasma react with the sputtered atoms on the chuck surface and form an inert gaseous residue and a passivation layer on the chuck surface. For example, in a ceramic chuck comprised of aluminum nitride, the oxygen combines with the aluminum nitride to form a layer of aluminum oxide on the surface of the chuck. The layer formation or passivation protects the chuck surface from further contamination during wafer processing while maintaining chuck performance. The thickness of the passivated dielectric layer depends on the voltage of the negative bias on the chuck and process duration.

Use of the sputter cleaning process in the manner described results in a ceramic chuck surface that is nearly free of all conductive films and adsorbed gases. After the sputter cleaning process is completed, the chuck is ready for the wafer processing cycle to restart without the need for pumping the chamber to the appropriate vacuum level, manual cleaning of the chamber or replacement of interrelated components due to contaminant film growth on the chuck surface.

Although only Argon and Oxygen are described to create the "cleaning plasma", other gases may also be used. Any inert gas, for example, Helium can replace Argon. The reactive gas can be selected by determining the type of reaction and substances that will be reacting to create the passivation of either the dislodged material, the chuck surface or both. For example, using Nitrogen as the reactive gas results in an added benefit of replenishment of the Aluminum nitride on the chuck surface.

As discussed above, the cleaning operation can be performed at relatively low temperatures. This is especially useful in sputter cleaning covalently bonded ceramics which, under vacuum conditions, may decompose into a metal rich surface layer at elevated temperature. However, the cleaning operation can also be conducted at high temperatures.

For example, a conductive surface film of graphitic carbon (a contaminant) formed on an aluminum nitride chuck surface during wafer processing can be removed by using the described method at high temperatures. Specifically, in this embodiment of the invention, a reactive gas such as oxygen is introduced to a heated chamber under a vacuum. The temperature is preferably in the range of 500–600° C. The chamber can be heated by a variety of known heat sources including pedestal heaters, heat lamps or the like. The reactive gas is ignited by an RF energy source to create the plasma. The plasma, by nature, also contributes to the operating temperature. The highly excited oxygen atoms in the plasma sputter contaminants from the chuck surface. Additionally, because of the high chamber temperature, nitrogen is selectively sputtered from the contaminant free surface leaving the surface aluminum rich. As such, the chuck surface readily reacts with the oxygen forming an aluminum oxide passivation layer. The passivation layer slows the regrowth of the undesirable conductive films. As mentioned earlier, the inventive method is not limited to the use of oxygen as the reactive gas and can use any reactive gas based on the materials reacting with the gas and desired amount of passivation.

Although the preferred embodiment of the present invention is discussed as a method for cleaning ceramic electrostatic chuck surfaces in PVD semiconductor wafer processing chambers, the method is also useful for cleaning any type of ceramic chuck such as those used in etch and chemical vapor deposition (CVD) wafer processing equipment.

Although the preferred embodiment of the present invention is discussed as a method for in-situ cleaning, the inventive method can be used in a dedicated cleaning chamber. For example, using the inventive method in a dedicated cleaning chamber any thin film (e.g., residue from a manufacturing process or exposure to air) can be removed from the surface of a ceramic component. To avoid process contamination, such cleaning is performed within the cleaning chamber prior to using the component at a high temperature in a vacuum environment.

Figure 2:
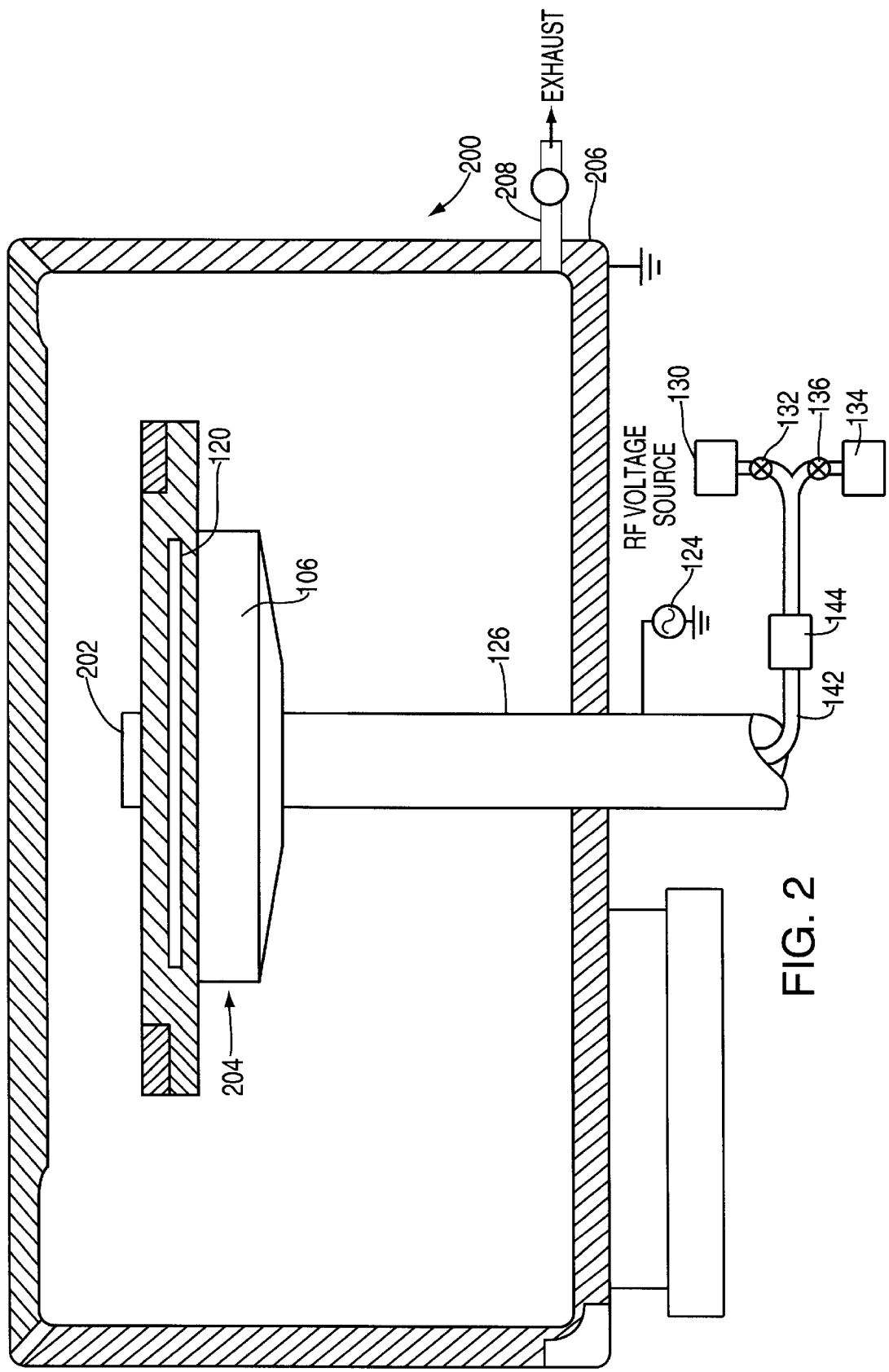
FIG. 2 depicts a cross-sectional view of a second embodiment of the invention wherein a cleaning chamber employs the inventive method.

FIG. 2 depicts an inventive cleaning chamber for ceramic components that utilizes the method of the present invention. The cleaning chamber 200 contains an RF biased pedestal (cathode) 204 and a grounded chamber wall 206 that forms an anode (i.e., the cleaning chamber does not contain a liftpin assembly, target or the like). The cleaning process is identical to that described above, except a contaminated ceramic component 202 is positioned on the pedestal 204. Gas from supplies 130 and 134 are introduced into the chamber via valves 132 and 136, mass flow controller 144 and conduit 142, respectively. Thereafter, the pedestal (cathode) 204 is energized by RF voltage source 124 to sputter etch the contaminants from the component. The free contaminants are removed from the chamber 200 via vacuum pump 208.

In sum, use of the inventive method provides in-situ cleaning of an electrostatic ceramic chuck surface without exposing the chuck surface to additional contamination from the atmosphere or breaking the vacuum in the chamber. As such, no disruption of the chamber environment is required to restore the chuck to a pre-process condition. The cleaning process is rapid so that chamber downtime is minimal. The process can be maintained and repeated as many times as necessary to recondition the chuck surface thereby promoting longer chuck life than is presently available. The cleaning process occurs at low-pressure ensuring that the sputtered material has low gas-scattering or conversely a high mean free path. This condition provides easy removal of waste products from the surface and prevents reaccumulation and excessive deposition on the chuck surface. The inventive apparatus provides a cleaning chamber capable of removing contaminants from any form of ceramic component or body.

Although various embodiments which incorporate the teachings of the present invention have been shown and described in detail herein, those skilled in the art can readily devise many other varied embodiments that still incorporate these teachings.

What is claimed is:

1. A PVD apparatus for performing insitu sputter etch cleaning and passivating of a ceramic substrate comprising:

a vacuum chamber having walls that form an anode;

a pedestal, supported within the vacuum chamber for supporting the substrate within said vacuum chamber;

an RF power supply connected to said pedestal thereby forming a cathode;

an inert gas supply, coupled to and supplying gas to the vacuum chamber to form a plasma in response to an RF bias applied between said anode and cathode, said plasma formed for sputter etch cleaning said substrate;

a target disposed above the pedestal for physical vapor deposition (PVD) processing; and a reactive gas supply containing a reactive gas for passivating said substrate.

2. The apparatus of claim 1 wherein a thickness of a passivated surface of the substrate depends on the level of bias on the cathode.

3. The apparatus of claim 1, wherein the substrate is a ceramic chuck body of the pedestal.

4. The apparatus of claim 1, wherein the substrate is a contaminated ceramic component disposed on the pedestal.

* * * * *